United States Patent
Beppu

(10) Patent No.: US 6,256,762 B1
(45) Date of Patent: Jul. 3, 2001

(54) SEMICONDUCTOR DISK DEVICE

(75) Inventor: Atsushi Beppu, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/155,497

(22) PCT Filed: Jan. 23, 1998

(86) PCT No.: PCT/JP98/00266

§ 371 Date: Sep. 23, 1998

§ 102(e) Date: Sep. 23, 1998

(87) PCT Pub. No.: WO98/33112

PCT Pub. Date: Jul. 30, 1998

(30) Foreign Application Priority Data

Jan. 23, 1997 (JP) .................................................. 9-024437

(51) Int. Cl.[7] .................................................. G11C 29/00
(52) U.S. Cl. .................................................. 714/763
(58) Field of Search .................................. 714/763, 764, 714/767, 769; 365/189.09

(56) References Cited

U.S. PATENT DOCUMENTS

| | | | | |
|---|---|---|---|---|
| 5,459,742 | * | 10/1995 | Cassidy et al. | 714/769 |
| 5,603,001 | * | 2/1997 | Sukegawa et al. | 711/103 |
| 5,673,383 | * | 9/1997 | Sukegawa | 714/8 |
| 5,717,886 | * | 2/1998 | Miyauchi | 711/103 |
| 5,742,934 | * | 4/1998 | Shinohara | 711/103 |
| 5,754,567 | * | 5/1998 | Norman | 714/773 |

\* cited by examiner

*Primary Examiner*—Albert Decady
*Assistant Examiner*—Shelly A Chase
(74) *Attorney, Agent, or Firm*—Venable; Robert J. Frank; Catherine M. Voorhees

(57) ABSTRACT

In a semiconductor disk unit, one sector data to be stored in a memory part is divided into a plurality of banks, and ECC data is prepared every bank so as to enhance the function of correcting errors even if there occur many error bits.

12 Claims, 9 Drawing Sheets

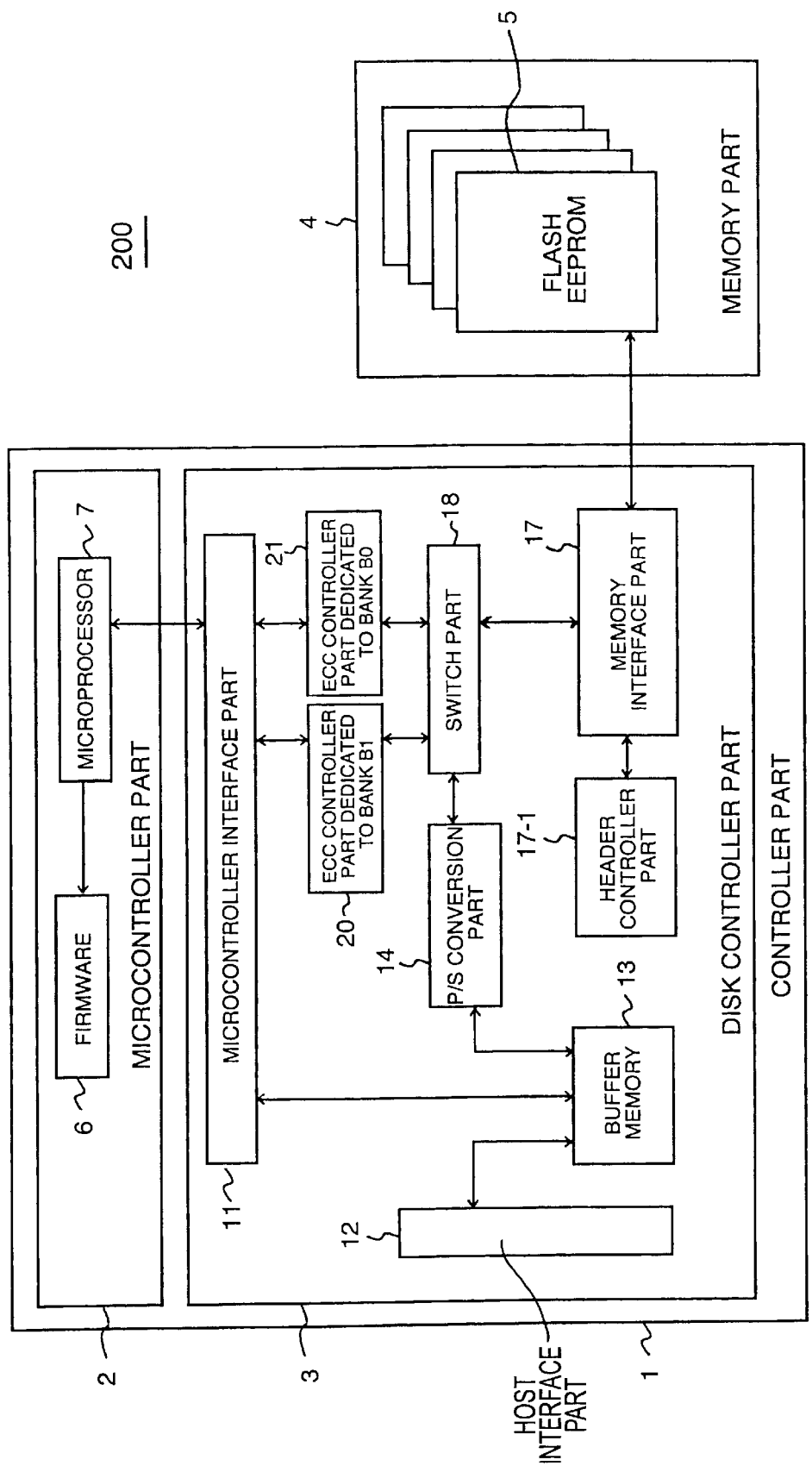

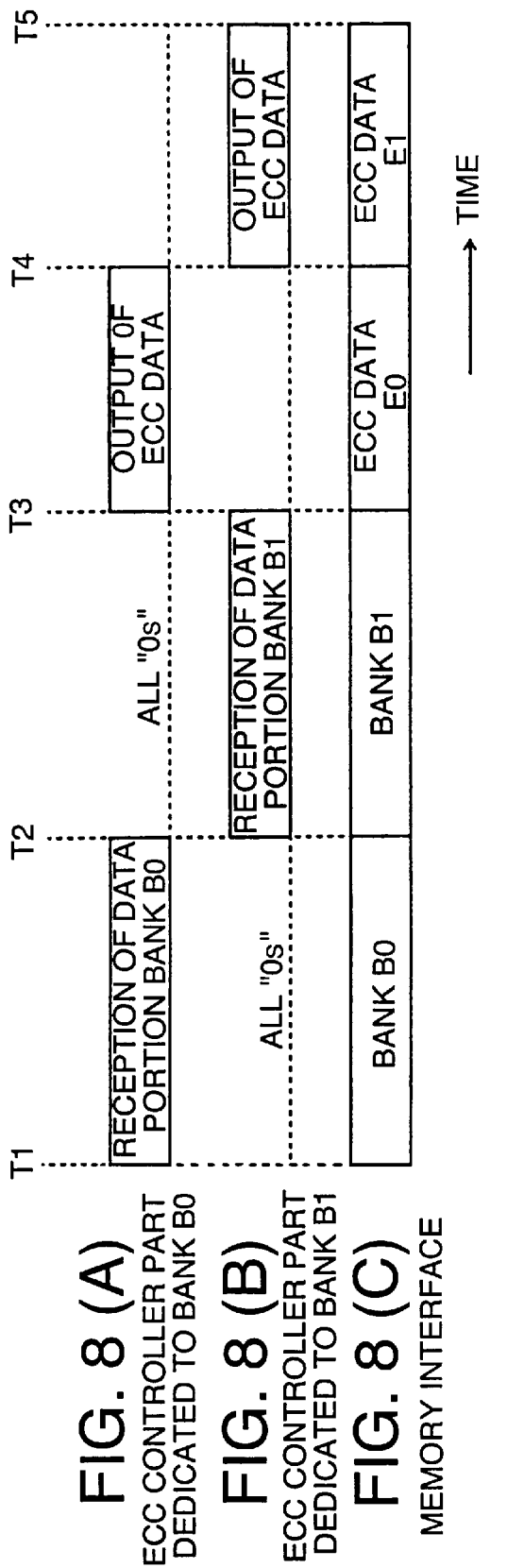

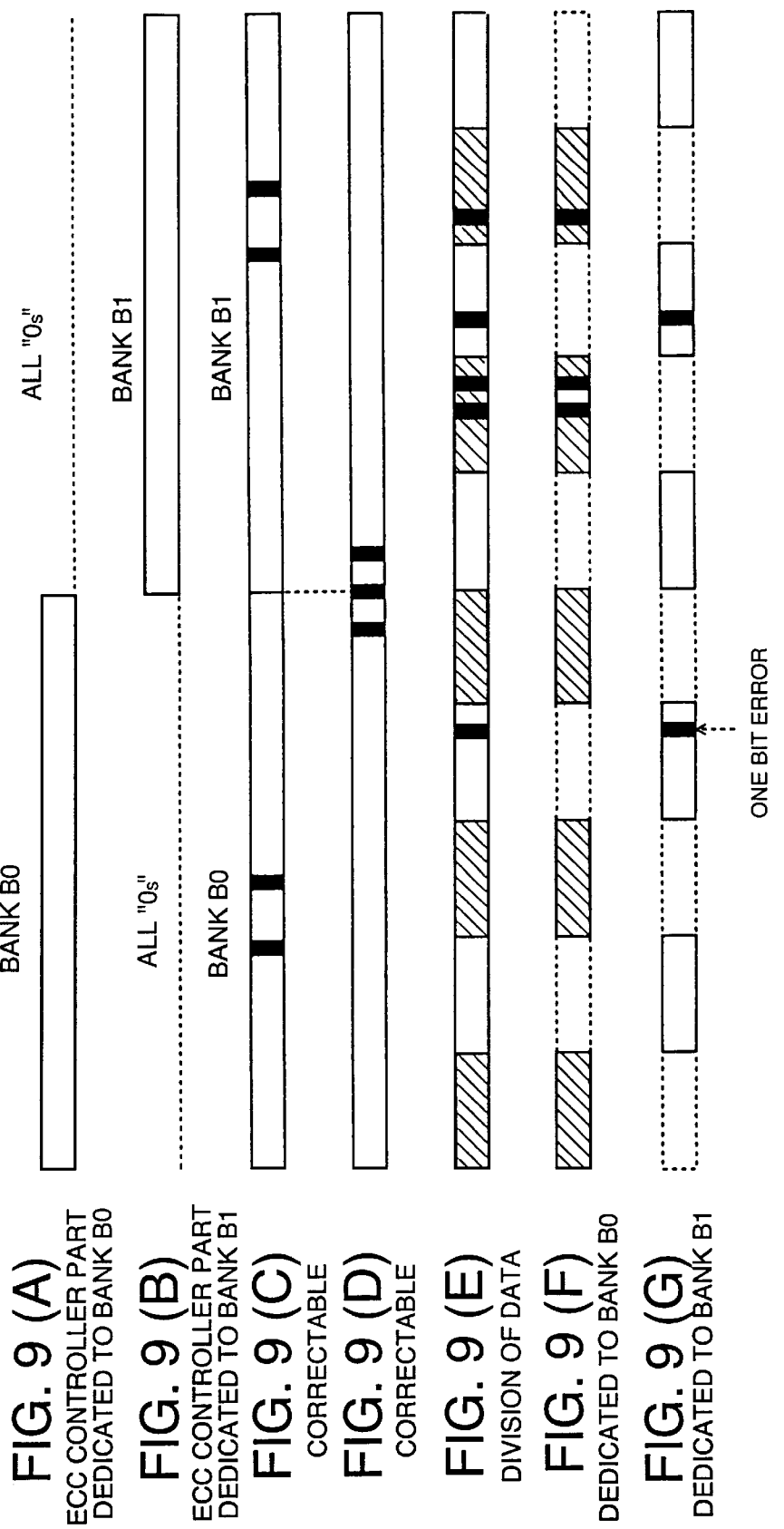

SEMICONDUCTOR DISK DEVICE

TECHNICAL FIELD

The invention relates to a semiconductor disk unit, particularly to a semiconductor disk unit having functions of detecting errors and of correcting errors when stored data is read.

BACKGROUND TECHNOLOGY

A demand for a semiconductor disk unit has been recently increased instead of a magnetic disk unit. The semiconductor disk unit is a non-volatile semiconductor memory such as a flash EEPROM which can electrically erase data at one time, namely, by the batch, and operates like the magnetic disk unit. The semiconductor disk unit has a disadvantage in a storage capacity and a cost thereof compared with the magnetic disk unit, but it has an advantage in high access speed and miniaturization thereof.

The operation of the semiconductor disk unit, particularly the write/read operation of data will be now described.

First, a host transfers data to be written to a semiconductor disk unit. The semiconductor disk unit writes received data on an incorporated flash EEPROM. The write operation of data is executed by the batch as a unit of sector. Data to be written comprises, for example, a 512-byte data portion, a header portion provided with attribute information relating to this data, and an ECC data portion provided with an error correction code (hereinafter referred to as ECC) data. Of which, data corresponding to the data portion is transferred from the host. Assume that the 512-byte data constituting the data portion corresponds to one sector. The header portion and the ECC data portion are generated in the semiconductor disk unit, and they are written on the flash EEPROM together with the data portion.

That is, data in one sector (hereinafter referred to as one sector data) transferred from the host is transferred parallely to the semiconductor disk unit by 8 bits or 16 bits. At this time, one sector data is transferred to a header controller part and an ECC controller part respectively incorporated in the semiconductor disk unit, The header controller part generates a header portion relating to the transferred data based on the same data. The ECC controller part generates ECC data based on the transferred data. Thereafter, the header portion, one sector data and the ECG data are respectively written on the flash EEPROM.

When written data is read, the header portion, the data portion, and the ECC data portion are read by the batch as one sector from the flash EEPROM. Meanwhile, the ECC controller part executes the calculation of the presence or absence of an error bit (or it is sometimes hereinafter referred to as error) in the data portion based on the ECC data portion. If there is no error in the data portion, the semiconductor disk unit transfers the data portion to the host as it is. On the other hand, if there is an error in the data portion, correctable error is corrected by the ECC controller part or a firmware, then the semiconductor disk unit transfers the corrected data to the host.

As mentioned above, if the semiconductor disk unit analyzes the ECC data by the ECC controller part, and decides that there is an error in the data portion read from the flash EEPROM, it executes error correction. The error correction is executed by deciding the presence or absence of the error relative to all bits of one sector data, then correcting the error. Accordingly, assuming that one sector data corresponds to 512 bytes, namely, 512×8 bits, for detecting one bit error as an error bit, it is necessary to execute the verification of all 512×8 bit data. Accordingly, a burden is imposed on the ECC controller part.

Further, if the number of occurrences of an error bit in one sector data portion is 1 bit, error correction can be executed by the ECC controller part which is constituted by hardware such as a gate circuit, etc. Meanwhile, if the number of an occurrences of error bit is about 2 bits or 3 bits in one sector data portion, error correction can be executed by a firmware. That is, if the number of an occurrences of error bit is about 2 bits or 3 bits, a burden imposed on the firmware increases. The error correction by hardware normally takes longer than the error correction by the firmware. Accordingly, a throughput of the error correction is lowered.

Further, even in the error correction by the firmware, if there is an error bit more than 4 bits in one sector data, the error correction can not be executed. Accordingly, if the bit number of a sector which is a minimum unit of write/read operation relative to the semiconductor disk unit increases, the probability of inclusion or the presence of error bit increases. As a result, the probability of deciding whether the written data is uncorrectable increases.

Still further, there has been known such characteristics that if the semiconductor disk unit repeats data write/read operation more than given times, the probability of occurrence of error bit increases sharply. Accordingly, the semiconductor disk unit executes the following processings if a bit error frequently occurs. First, an error bit is corrected and a program for required processing is normally operated, and finally, the processing required by a host is terminated. Meanwhile, a storage area of a sector where error occurred is prohibited in use relative to the flash EEPROM, and a processing for setting a given area (it is generally called a substituting track which is prepared in advance as a substituting area) as a new storage area is executed. In cases where write/read operation is executed relative to the storage area to be substituted before the processing for setting the substituting track is terminated, it is preferable to have a system in which a program of such processing is not terminated abnormally. However, if such substituting processing frequently occurs, it is prone to deteriorate a high access speed which is a feature of the semiconductor disk unit. Further, if more substituting storage area is secured, more storage capacity of the flash EEPROM increases, thereby impeding the miniaturization of the semiconductor disk unit and entaining the increase of cost.

SUMMARY OF THE INVENTION

Accordingly, it is an object of the invention to provide the semiconductor disk unit capable of realizing the error correction at high speed.

It is another object of the invention to provide a semiconductor disk unit capable of dealing with error correction even if there occur many error bits.

It is still another object of the invention to provide a semiconductor disk unit capable of realizing miniaturization and reduction of the increase of cost to the utmost.

To achieve the above objects, a semiconductor disk unit for reading data from a semiconductor memory in units of a given amount of bits comprises a memory part comprising the semiconductor memory, a temporary storage part for holding a given amount of bit data so as to transfer the same data to the memory part, a division part for dividing a given amount of bit data to be transferred from the temporary storage part to the memory part into a plurality of sub-data, and an error correction code controller part for generating an error correction code data for every sub-data which is added to the data and stored in the memory part, wherein the error correction code controller part decides whether the data read from the memory part has an error or not for every sub-data based on the error correction code data, and executes necessary error correction.

The semiconductor disk unit of the invention may be structured so that the plurality of sub-data and the plurality of error data generated corresponding to the sub-data are alternately stored in the memory part.

The semiconductor disk unit of the invention may be structured so that the plurality of sub-data and the plurality of error data generated corresponding to the sub-data are collectively stored in the memory part.

The semiconductor disk unit of the invention may be structured so that the memory part is formed of a nonvolatile memory which is erasable by the batch.

Further, to achieve the above objects, a semiconductor disk unit for reading data from a semiconductor memory in units of a given amount of bits comprises a memory part comprising the semiconductor memory, a temporary storage part for holding a given amount of bit data so as to transfer the same data to the memory part, a division part for dividing a given amount of bit data to be transferred from the temporary storage part to the memory part into a plurality of sub-data, and first and second error correction code controller parts for generating error correction code data in selected parts of the respective sub-data which are added to the data and stored in the memory part, wherein the first and second error correction code controller parts decide whether the data read from the memory part has an error or not in the selected parts of the sub-data based on the error correction code data, and execute necessary error correction, and a transfer gate part capable of selectively transferring between one of the first and second error correction code controller parts and the memory part.

Further, the semiconductor disk unit of the invention may be structured in that the transfer gate part transfers invalid data in operation to another of two error correction code controller parts in a state where data can be transferred between one of two error correction code controller parts and the memory part.

Further, the semiconductor disk unit of the invention may be structured such that the transfer gate part can transfer a part of consecutive data of the plurality of sub-data to the first error correction data controller part and can transfer another part of consecutive data of the plurality of sub-data to the second error correction data controller part.

Further, the semiconductor disk unit of the invention may be structured so that the transfer gate part can transfer a part of inconsecutive data of the plurality of sub-data to the first error correction data controller part and can transfer another part of inconsecutive data of the plurality of sub-data to the second error correction data controller part.

Further, the semiconductor disk unit of the invention may be structured so that the memory part is formed of a nonvolatile memory which is erasable by the batch.

BRIEF DESCRIPTION OF DRAWINGS

FIG. 7 is a block diagram showing the construction of a semiconductor disk unit according to a second embodiment of the invention;

FIG. 8(A) to FIG. 8(C) are timing charts for explaining a data transfer processing in the semiconductor disk unit according to the second embodiment of the invention; and FIG. 9(A) to FIG. 9(G) are views for explaining effects of the semiconductor disk unit according to the second embodiment of the invention.

BEST MODE FOR CARRYING OUT THE INVENTION

A semiconductor disk unit of the invention will be now explained with reference to the attached drawings. The reference drawings merely schematically illustrate the size, shape and arrangement of respective components to the extent that the invention can be understood. Accordingly, the invention is not limited to the illustrated embodiments.

First Embodiment [FIGS. 1 to 6]

A semiconductor disk unit according to a first embodiment of the invention will be now described with reference to FIGS. 1 to 6.

Figure 1:
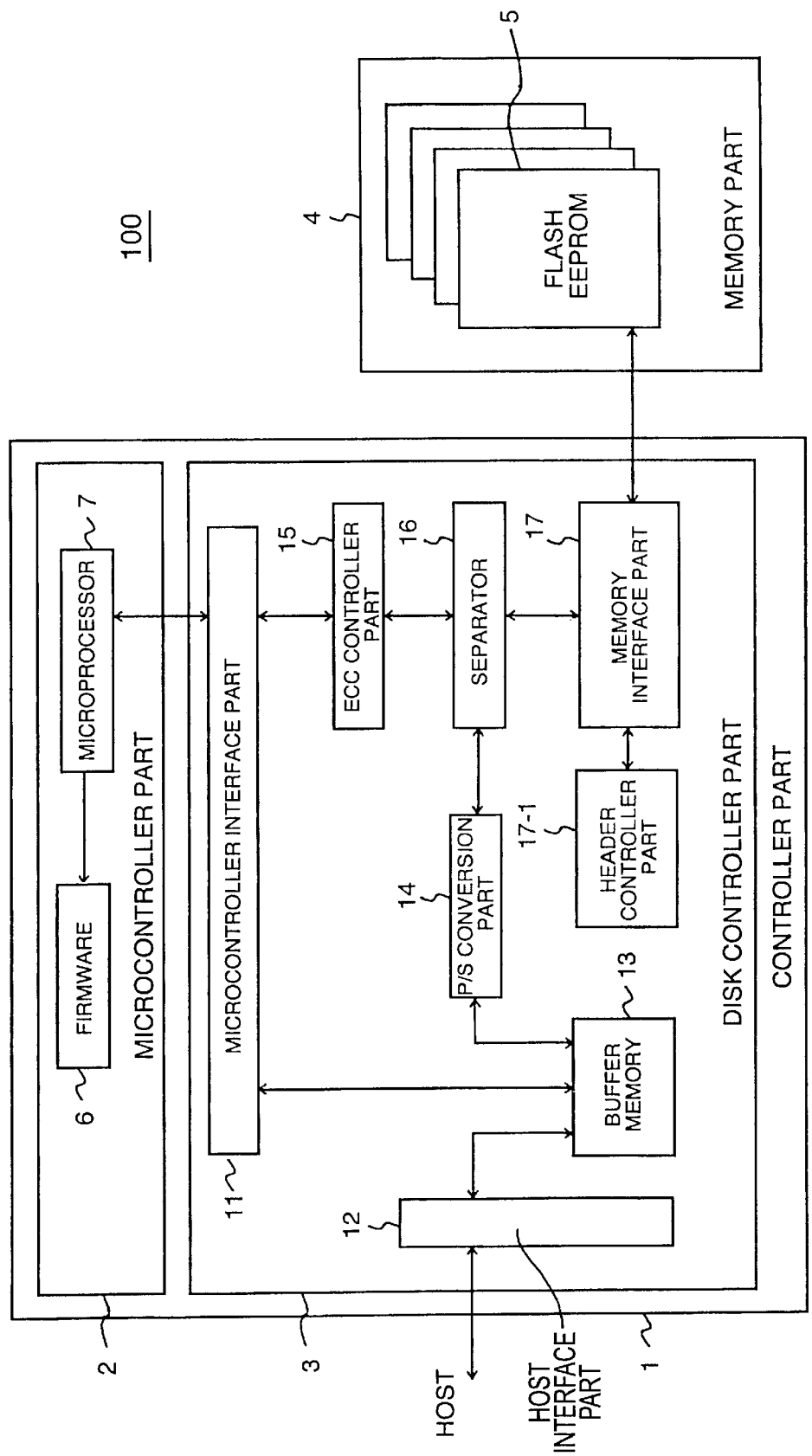
FIG. 1 is a block diagram showing the construction of a semiconductor disk unit according to the first embodiment of the invention.

FIG. 1 is a block diagram showing the construction of the semiconductor disk unit according to the first embodiment of the invention.

In FIG. 1, a semiconductor disk unit 100 comprises a controller part 1 and a memory part 4. The controller part 1 controls data write/read processing relative to the memory part 4 which comprises a plurality of flash EEPROMs 5.

The controller part 1 comprises a microcontroller part 2 and a disk controller part 3. The microcontroller part 2 executes error correction processing if there are plurality of error bits in data or controls write/read processing relative to the disk controller part 3.

The microcontroller part 2 comprises a firmware 6 and a microprocessor 7. The firmware 6 is a program for executing an error correction processing. The microprocessor 7 reads the program of the firmware 6 for executing an error correction processing of data.

The disk controller part 3 comprises a microcontroller interface part 11, a host interface part 12, a buffer memory 13, a parallel-serial conversion part (hereinafter referred to as P/S conversion part) 14, an ECC controller part 15, a separator 16, and a memory interface part 17.

The microcontroller interface part 11 controls data transfer between the microcontroller part 2 and the buffer memory 13. That is, the microcontroller part 2 accesses data stored in the buffer memory 13 through the microcontroller interface part 11, and for example, executes an error correction processing.

The host interface part 12 controls data transfer between a host as an external device (not shown) and the buffer memory 13. That is, the buffer memory 13 has functions for receiving data which is to be stored in the memory part 4 and is transferred from the host, and for sending out data which is read from the memory part 4 to the host.

The buffer memory 13 is a memory for temporarily storing a data amount which is dealt by one time write processing on the memory part 4 or a data amount which is sent out by one read processing from the memory part 4 to the host. That the is, assuming that data amount which is dealt by one write processing or the data amount which is sent out to the host by one read processing is one sector data (e.g., 512-byte data), such one sector data is temporarily stored in the buffer memory 13 when it is subjected to write/read processing. It is differentiated depending on the design of a semiconductor disk unit what byte one sector data comprises, but one sector data comprises 512 bytes in the first embodiment.

The P/S conversion part 14 is a data conversion circuit for serially transferring data stored in the buffer memory 13 to the memory interface part 17 or for parallelly transferring data transferred from the memory interface part 17 to the buffer memory 13. That is, data transferred from the host through the host interface part 12 is parallel data, and data read from the memory part 4 is serial data. Accordingly, data to be sent out from or received by the host and data to be subjected to write/read processing relative to the memory part 4 are matched with each other by the P/S conversion part 14.

The ECC controller part 15 prepares an error correction code relative to respective data when data is written on the memory part 4, refers to the error correction code when data is read from the memory part 4 to execute the error correction in data. The error correction code prepared by the ECC controller part 15 is written on the memory part 4 together with data to be written on the memory part 4.

The separator 16 divides data transferred from the host into given number of banks, or executes the control of the transfer of the divided data to the ECC controller part 15, the memory interface part 17, or the P/S conversion part 14.

The memory interface part 17 executes the transfer of data which is transferred from the host and processed in the disk controller part 3 to the flash EEPROM 5 constituting the memory part 4, and executes the reception of data read from the memory part 4 by the disk controller part 3.

A header controller part 17-1 executes the preparation of a header portion relative to data transferred from the host and the preparation of an error generation code relative to the prepared header portion. The prepared header portion is written on the memory part 4 together with the corresponding data, and the prepared error correction code is written on the memory part 4 together with the error correction code relative to the corresponding data. The header controller part 17-1 decides the presence or absence of error in the header portion which is read at the same time when data from the memory part 4 is read, and executes error correction, if need be. Accordingly, the header controller part 17-1 has a register for holding the header portion.

The construction of data stored in the flash EEPROM 5 constituting the memory part 4 will be now described with reference to FIG. 2.

Figure 2:
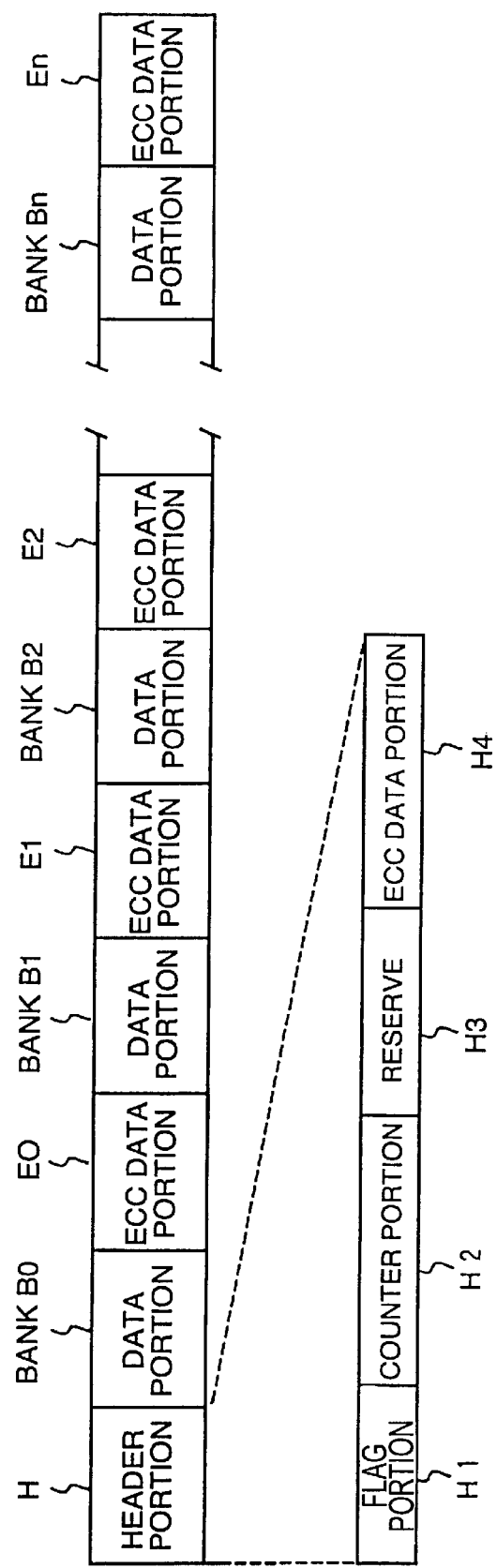
FIG. 2 is a view for explaining data to be stored in the semiconductor disk unit according to the first embodiment of the invention.
Figure 3:
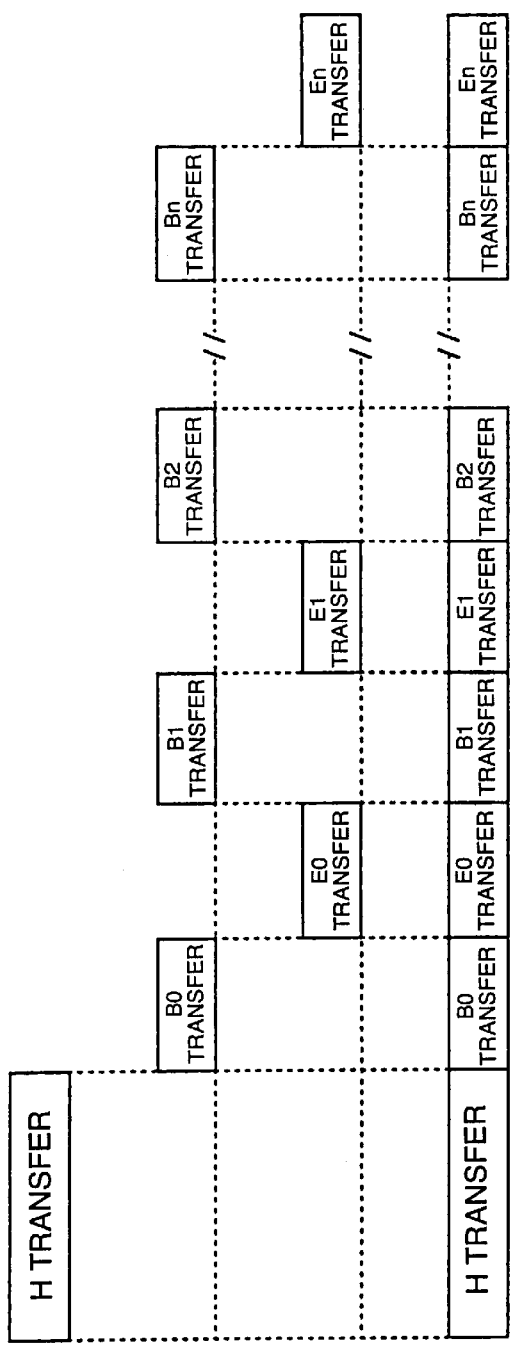
FIG. 3(A) to FIG. 3(C) are timing charts for explaining a data transfer processing in the semiconductor disk unit according to the first embodiment of the invention.

As shown in FIG. 2, the data comprises a header portion H, and data portions B0 to Bn and ECC data portions E0 to En which are alternately repeated following the header portion H. That is, FIG. 2 shows an example where data transferred from the host is divided into n pieces by the separator 16. Respective divided data are called banks, and they are represented by banks B0 to Bn in FIG. 2. For example, if one sector data comprises 512 bytes, the respective banks comprise 64 bytes if the same data is divided into eight banks. The ECC data portions E0 to En used in error correction of the respective banks are added following the respective banks.

The header portion H comprises, for example, a flag portion H1, a counter portion H2, a reserve H3 and an ECC data portion HE. The flag portion H1 stores therein a flag for managing data. The counter portion H2 stores therein information representing the number of reloading of data. The error correction code relative to the header portion H which is generated by the header controller part 17-1 is stored in the ECC data portion HE.

That is, the semiconductor disk unit 100 as shown in FIG. 1 holds data in one sector which is a unit for write/read processing in the buffer memory 13. The P/S conversion part 14 serially transfers this data to the separator 16. The separator 16 transfers data to respective one banks, for example, data corresponding to the bank B0 in FIG. 2 to the ECC controller part 15 and the memory interface part 17. The memory interface part 17 transfers this data to the header controller part 17-1. The header controller part 17-1 prepares the header portion H such as an error correction code or a flag relative to the transferred data. The header portion H prepared by the header controller part 17-1 is stored in the memory part 4 through the memory interface part 17. Data corresponding to the bank B0 following the header portion H is stored in the memory part 4 by the memory interface part 17. The ECC controller part 15 prepares an error correction code relative to the transferred data. The prepared error correction code is stored in the memory part 4 through the separator 16 and the memory interface part 17 following the header portion H and the bank B0 which are previously stored in the memory part 4. Similarly, the processings relative to the banks B1 to Bn are executed in the same manner as set forth above. Accordingly, the banks B1 to Bn and the ECC data portions E1 to En are alternately stored in the memory part 4.

FIG. 3(A) to FIG. 3(C) are timing charts for explaining the above operations more clearly.

The header portion H prepared by the header controller part 17-1 is first transferred from the header controller part 17-1 to the memory interface part 17. The memory interface part 17 transfers the header portion H to the memory part 4. Thereafter, the buffer memory 13 transfers the bank B0 to the memory interface part 17 and the separator 16. The memory interface part 17 transfers the bank B0 to the memory part 4. During the transfer of the bank B0, the separator 16 prepares an error correction code relative to the bank B0. After the transfer of the bank B0, the separator 16 transfers the error correction code to the memory interface part 17. The memory interface part 17 transfers the error correction code to the memory part 4. Subsequently similarly, the transfer of banks B1 to Bn from the buffer memory 13 to the memory part 4 through the memory interface part 17 and the transfer of the ECC data E0 to En from the separator 16 to the memory part 4 through the memory interface part 17 are executed alternately. That is, the header portion H, the data of bank B0, the ECC data E0 corresponding to the data of bank B0, data of the bank B1, ECC data E1 corresponding to the bank B1, . . . , data of the bank Bn, the ECC data En corresponding to the bank Bn are consecutively written on the flash EEPROMs 5 of the memory part 4 in this order.

Figure 4:
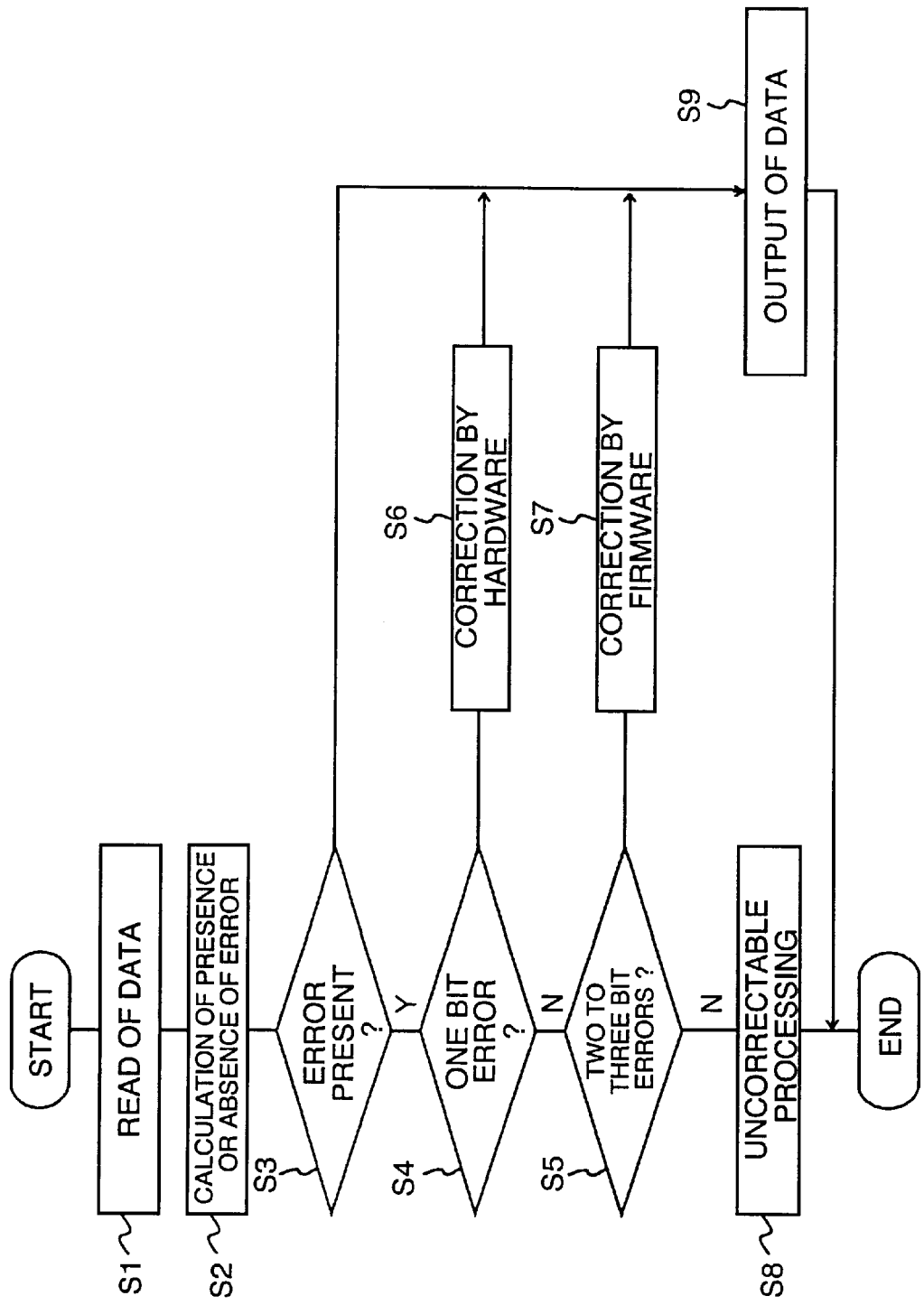
FIG. 4 is a flowchart showing an error correction processing in the semiconductor disk unit according to the first embodiment of the invention.
Figure 5:
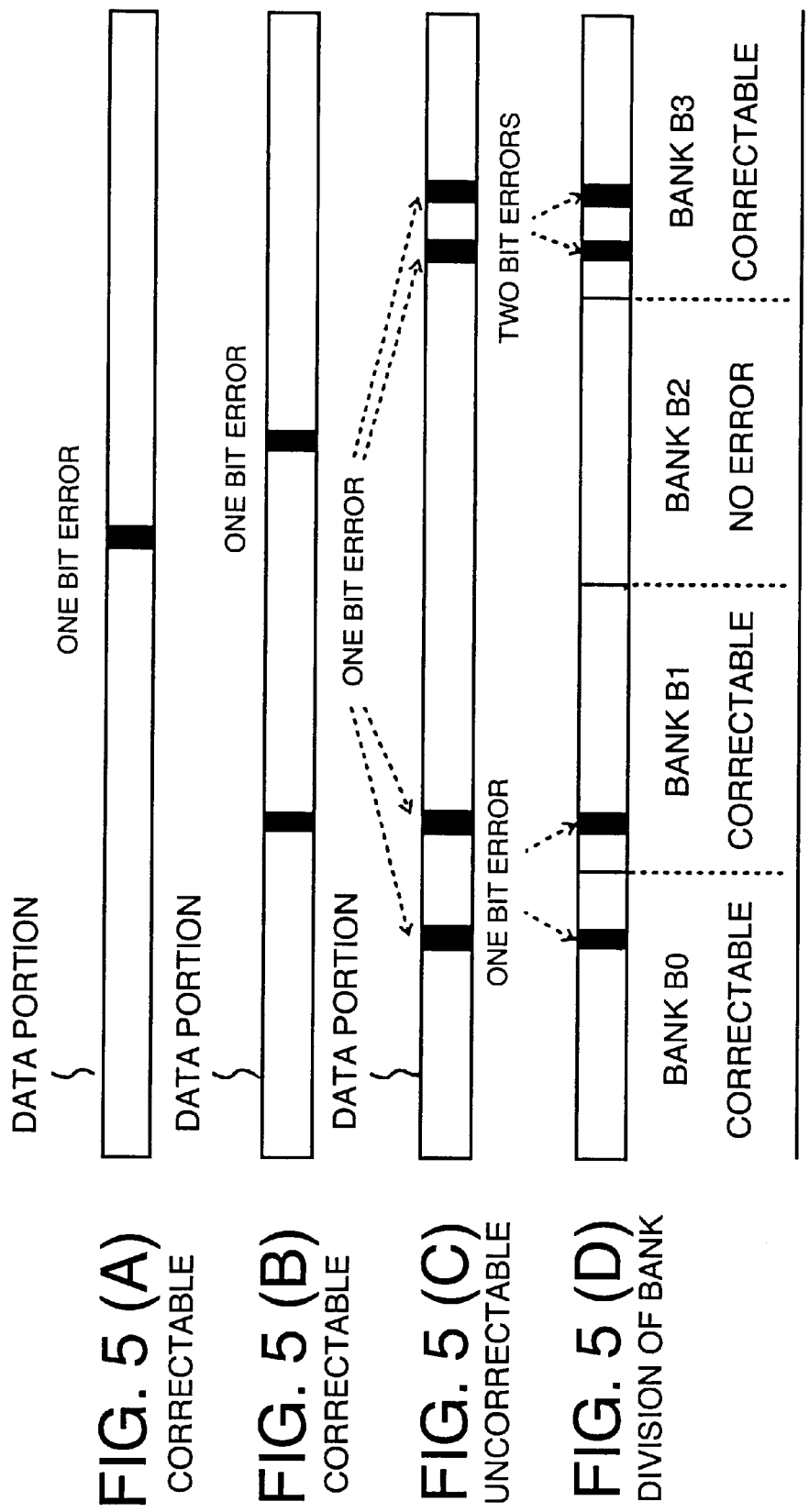
FIG. 5(A) to FIG. 5(D) are views for explaining effects of the semiconductor disk unit according to the first embodiment of the invention.

Next, the procedure for executing an error detection processing and an error correction processing in the case of reading of data written in the manner set forth above will be explained with reference to FIG. 4. FIG. 4 is a flowchart showing the operations of an error detection processing and an error correction processing.

Data which is required to be read from the host is first read from the flash EEPROM 5 (step S1) of the memory part 4. Data read at this time is one sector data (e.g., 512 bytes). The corresponding header portion and the ECC data are read together with this data. That is, the memory interface part 17 transfers the header portion H which is information transferred at first to the header controller part 17-1. Next, the data B0 to Bn and the ECC data E0 to En per unit bank are alternately read and are transferred to the buffer memory 13 and the ECC controller part 15, respectively. This can be performed by switching the sender of information transferred from the memory interface part 17 to the P/S conversion part 14 and the ECC controller part 15 by the separator 16. Accordingly, the read data B0 to Bn are temporarily stored in the buffer memory 13 through the memory interface part 17, the separator 16 and the P/S conversion part 14. The read ECC data E0 to En are temporarily stored in the ECC controller part 15 through the memory interface part 17 and the separator 16.

The ECC controller part 15 executes the calculation of the presence or absence of the error relative to data B0 to Bn based on the read ECC data E0 to En per unit bank (step S2). The calculation is not different from a method which has been conventionally executed. Based on the result of this calculation, it is decided whether there is an error in the data B0 to Bn (step S3). If it is decided that there is no error, a program goes to step S9 where the data B0 to Bn which are stored in the buffer memory 13 are transferred to the host through the host interface part 12 as they are.

If it is then determined if there is an error, it is decided that the error is one bit error or not (step S4). If the error is a one bit error, the content of data which is stored in the buffer memory 13 is corrected by hardware in the ECC controller part 15 (step S6). The program goes to step S9 upon completion of the correction processing. The correction processing by the hardware can be executed at very high speed.

In the case of 2-bit or more error, the program goes to step S5 where it is determined if the error is two to three bit errors or not. In the case of two to three bit errors, the correction of error by the firmware 6 is executed (step S7). That is, the content of data which is stored in the buffer memory 13 is corrected by the microcontroller part 2 based on the firmware 6. After the execution of correction processing, the program goes to step S9. In the case of a four bit or more errors, it is decided in this embodiment that the error is uncorrectable. In this case, a given uncorrectable processing is executed. That is, the data B0 to Bn which are stored in the buffer memory 13 are transferred to the host as they are if there is no error, while the corrected data are transferred to the host respectively through the host interface part 12 if the error was corrected.

The semiconductor disk unit 100 of the first embodiment has the following effect as a result of the execution of the above mentioned operations. FIG. 5(A) to FIG. 5(D) are views for explaining the effects of the semiconductor disk unit 100 in the first embodiment. FIG. 5(A) to FIG. 5(C) represent, as reference examples, error occurrence status when one sector data is not divided like the invention, and the propriety of error processing in each status. FIG. 5(D) represents, for example, error occurrence status when data is divided into four banks B0 to B3, and the propriety of error processing in this states according to the first embodiment of the invention.

First, FIG. 5(A) is a case where there is one bit error in one sector. In this case, error correction by the hardware in the ECC controller part 15 can be executed based on the ECC data. Further, assuming that one sector comprises 512 bytes in this case, it is necessary to retrieve error correction locations for all 512×8 bits. Accordingly, it is necessary to prepare complex hardware to execute high speed processing. The more the amount of data constituting one sector increases, the more burden imposed on the hardware increases.

FIG. 5(B) is a case where there are two bit errors in one sector. In this case, error correction by the firmware 6 in the microcontroller part 2 can be executed based on the ECC data. Further in this case, the correction processing takes longer than the error correction by the hardware 6.

FIG. 5(C) is a case where there are four bit errors in one sector. In this case, the error is uncorrectable even if the firmware 6 is used.

FIG. 5(D) is a case where one sector data is divided into four banks and there are four bit errors in the one sector data. As is evident from FIG. 5(D), there is only one bit error in respective banks (B0 and B1) or two bit errors (in bank B3) when viewing respective banks B0 to B3. Accordingly, since the ECC data is prepared with every bank, the error in the bank B0 or B1 can be corrected by the hardware while the error in the bank B3 can be corrected by the firmware. Meanwhile, there is no error in the bank B2, it is not necessary to execute error correction.

According to the first embodiment of the invention as set forth above, it is possible to execute error correction by dividing one sector data as a unit into a plurality of banks and administrating them, even if there are bit errors which have been uncorrectable so far. Viewing a plurality of banks, for example, in the bank B0 and the bank B1 in FIG. 5(D), since the error correction can be executed by the hardware, it can be executed at high speed. Further, since the number of bits in the respective banks which are subjected to error correction is small, the time required for correction processing is reduced. Accordingly, the burden imposed on the firmware in the semiconductor disk unit 100 is reduced, realizing high speed error correction.

Assume that one sector data comprises 512 bytes (=4096 bits), and it is divided into eight banks (512-bit data per one bank). The ECC data of about 90 bits is normally required for 4096-bit data. If this ECC data is divided into eight banks, the ECC data of each bank becomes about 10 to 14 bits. Accordingly, the data length extending from the header portion H to the ECC data portion En (n=8) can not be significantly lengthened as a whole. Further, since the data for respective banks are subjected to error check or error correction while they are serially transferred, the error correction is not complex or the time required for error correction processing does not increase sharply even if the ECC data portion increases.

Although it is explained in the first embodiment that one bit error can be corrected by hardware, two to three bit errors can be corrected by firmware and four bit or more errors are uncorrectable, the invention is not limited thereto, for example, the number of correctable bits and the number of uncorrectable bits by the hardware or software can be increased or decreased by a suitable design.

Figure 6:
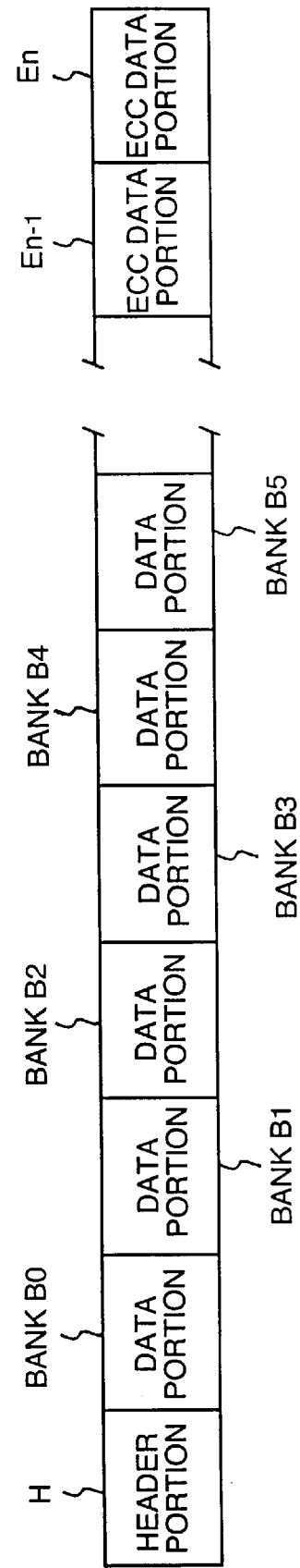
FIG. 6 is a view for explaining modification of data to be stored in the semiconductor disk unit according to the first embodiment of the invention.

In FIG. 2, although the divided banks B0 to Bn and respective ECC data E0 to En are alternately stored, they are not limited thereto. For example, as shown in FIG. 6, following the header portion H, the banks B0 to Bn which are divided into plural numbers are consecutively formed, and following the bank Bn, the ECC data E0 to En of respective banks may be consecutively formed. In this case, although the write operation takes longer than that in the first embodiment, the switching operation of the separator 16 may be reduced when the banks B0 to Bn are temporarily stored in the buffer memory 13 or when the ECC data E0 to En are stored in the ECC controller part 15 at the same time. Even in such a construction, the same effect as the first embodiment can be realized.

As mentioned above, the semiconductor disk unit 100 in the first embodiment is effective for a semiconductor disk unit in which errors are prone to occur in various portions when the number of writing exceeds a given time.

Second Embodiment [FIGS. 7 to 9]

A semiconductor disk unit according to a second embodiment will be now described with reference to FIGS. 7 to 9. Since the bit width which is subjected to the preparation of the ECC data becomes a unit bank in the first embodiment, there is a probability of needing the design for a new ECC controller part. Accordingly, the second embodiment can attain the same effect as the first embodiment using the ECC controller parts for preparing the ECC data relative to one sector bit width.

FIG. 7 is a block diagram showing the construction of a semiconductor disk unit 200 according to the second embodiment of the invention. Components which are the same as those of the first embodiment are denoted by the same reference numerals.

In FIG. 7, a microcontroller part 2 and a memory part 4 are the same as those of the first embodiment. In a disk controller part 3, a microcontroller interface part 11, a host interface part 12, a buffer memory 13, a P/S conversion part 14, a memory interface part 17 and a header controller part 17-1 are the same as those of the first embodiment. In the second embodiment, two ECC controller parts 20 and 21 are provided instead of the ECC controller part 15 in the first embodiment and a switch part 18 is provided instead of the separator 16 in the first embodiment.

The switch part 18 is interconnected with the P/S conversion part 14, the memory interface part 17, two ECC controller parts 20 and 21 so as to transfer data therebetween. The switch part 18 operates to selectively transfer data from the P/S conversion part 14 to the memory interface part 17 and the ECC controller parts 20 and 21. Further, the switch part 18 operates to selectively transfer data from memory interface part 17, or the ECC data to the P/S conversion part 14 and the ECC controller parts 20 and 21.

Each of the ECC controller parts 20 and 21 has the same circuit construction as the conventional ECC controller part. That is, the ECC controller parts 20 and 21 have a function to prepare the ECC data relative to one sector data or a function to execute error correction relative to one sector data.

The reason why there are provided two ECC controller parts in the second embodiment will be now described with reference to FIG. 8(A) to FIG. 8(C). FIG. 8(A) to FIG. 8(C) are timing charts for explaining data transfer operation of the semiconductor disk unit 200 in the second embodiment. FIG. 8(A) shows contents of data to be transferred to the ECC controller part 20. FIG. 8(B) shows contents of data to be transferred to the ECC controller part 21. FIG. 8(C) shows contents of data to be stored in the memory part 4 through the memory interface part 17. Meanwhile, assume that one sector data has been already temporarily stored in the buffer memory 13.

First, at time t1 in FIG. 8, data transfer is started. During times t1 to t2, data corresponding to a half of one sector data, for example, 256-byte data if one sector comprises 512 bytes, is transferred to the switch part 18 through the P/S conversion part 14. This data is called a bank B0. The switch part 18 transfers data of the bank B0 to the ECC controller part 20 and the memory interface part 17 at the same time. Accordingly, data of the bank B0 is stored in the memory part 4 and the ECC controller part 20. During times t1 to t2, all "0s" data are transferred from the switch part 18 to the ECC controller part 21. As a result, all "0s" data of 256 bytes are stored in the ECC controller part 21.

Next at time t2, the switch part 18 switches the object of data to be transferred to the ECC controller part 21 and the memory interface part 17. During times t2 to t3, data corresponding to a remaining half of one sector data is transferred to the switch part 18 through the P/S conversion part 14. This data is called a bank B1. The switch part 18 transfers data of the bank B1 to the ECC controller part 21 and the memory interface part 17 at the same time. Accordingly, data of the bank B1 is stored in the memory part 4 and the ECC controller part 21. During times t2 to t3, all "0s" data are transferred from the switch part 18 to the ECC controller part 20. As a result, all "0s" data of 256 bytes are stored in the ECC controller part 20.

With such a construction, data stored in the buffer memory 13 (data comprising the bank B0 and the bank BY) are stored in the memory part 4. Further, the first half of 256-byte data of the bank B0 and the latter half of 256-byte data of all "0s" are respectively stored in the ECC controller part 20. Still further, the first half of 256-byte data of all "0s" and the latter half of 256-byte data of the bank B1 are stored in the ECC controller part 21. In such a manner during times t1 to t3, one sector data is stored in the memory part 4, and the ECC controller parts 20 and 21. The ECC controller part 20 prepares ECC data E0 corresponding to the data of bank B0. The thus prepared ECC data E0 corresponding to the data of bank B0 is transferred to the memory part 4 through the memory interface part 17 at time t3. Similarly, the ECC controller part 21 prepares ECC data E1 corresponding to the prepared data of bank B1. The thus prepared ECC data E1 corresponding to the prepared data of bank B1 is transferred to the memory part 4 through the memory interface part 17 at time t4. At time t5, the data transfer is terminated.

Data of bank B0, data of bank B1, ECC data E0 corresponding to data of bank B0, and the ECC data E1 corresponding to the data of bank B1 are respectively sequentially stored in this order in the flash EEPROMs 5 constituting the memory part 4. The ECC controller part 20 relative to the data of bank B0, and the ECC controller part 21 relative to the data of the bank B1 respectively prepare the ECC data relative to one sector data.

The semiconductor disk unit 200 according to the second embodiment of the invention has the following effects with the execution of the operations set forth above. FIG. 9(A) to FIG. 9(B) are views for explaining effects of the semiconductor disk unit 200 according to the second embodiment. FIG. 9(A) shows contents of data to be processed by the ECC controller part 20. FIG. 9(B) shows contents of data to be processed by the ECC controller part 21. FIGS. 9(C) and 9(D) show error occurrence status when data is divided into the banks B0 and B1 and the propriety of the error processing, wherein FIG. 9(C) shows cases where four bit errors are present and FIG. 9(D) shows ca where three bit errors are centralized in a boundary between the bank B0 and the bank B1.

As shown in FIG. 9(A), data transferred to the ECC controller part 20 comprises the data of the bank B0 at the first half thereof and all "0s" data at the latter half thereof, while as shown in FIG. 9(B), data transferred to the ECC controller part 21 comprises all "0s" data at the first half thereof and the data of bank B1 at the latter half thereof.

As shown in FIG. 9(C), if four bit errors of one sector data are decentralized, respective banks have two bit errors.

Accordingly, if the ECC controller parts 20 and 21 judge that there are two bit errors in one section, error correction can be executed. As mentioned above, since one sector data is divided into two banks in the second embodiment, error correction can be executed even if uncorrectable four bit or more errors are present in one sector data. Meanwhile, in cases where two bit errors are decentralized in one so that, one sector data is divided into two banks, error correction can be executed as respective one bit error. Since the error correction can be executed by a hardware in this case, a high speed error correction processing is expected. Since the ECC controller parts 20 and 21 may execute the error correction processing relative to one sector data, two circuit arrangements each of which is the same as the conventional one may be prepared. Accordingly, it is expected that the design of circuit arrangement is facilitated compared with that of the first embodiment.

Further, as shown in FIG. 9(D), in cases where one bit error is centralized in a boundary between the bank B0 and the bank B1 to form three bit errors, it is possible to execute error correction if there are about three bit errors even if three bit errors are present in either of the banks. However, the portion where errors are centralized is not always the boundary portion between the bank B0 and the bank B1. Accordingly, in cases where errors are centralized in one sector data at a plurality of portions, the data may be divided into the bank B0 and the bank B1 in the following manner.

FIGS. 9(E) to 9(G) are views for explaining modified examples of the second embodiment. FIG. 9(E) shows a division status of one sector data and an error occurrence status. FIG. 9(F) shows a status where data is transferred to the ECC controller part 20 and a status of errors which are present in the data transferred to the ECC controller part 20. FIG. 9(G) shows a status where data is transferred to the ECC controller part 21 and a status of errors which are present in the data transferred to the ECC controller part 21.

As shown in FIG. 9(E), hatched portions and non-hatched portions are alternately arranged in one sector data. The hatched portions show the data of bank B0 to be transferred to the ECC controller part 20, while the non-hatched portion show the data of bank B1 to be transferred to the ECC controller part 21. That is, in FIG. 9(E), even if five bit errors (marked by black) are present in one sector data, these errors are decentralized in the manner that three bit errors are decentralized in the data of bank B0 as shown in FIG. 9(F) while two bit errors are decentralized in the data of bank B1 as shown in FIG. 9(G). Assume that all "0s" data are present as invalid data in the dotted line portions in FIGS. 9(F) and 9(G). Accordingly, 9(F) and 9(G) show that the data having one sector length is transferred to the ECC controller parts 20 and 21.

As mentioned above, in the modified examples in FIGS. 9(E) to 9(F), since the data to be transferred to the ECC controller parts includes a half sector of all "0s" data as the invalid data as shown in dotted line portions, the half sector data becomes the object to be processed in respective ECC controller parts.

Accordingly, the burden imposed on the processing of the respective ECC controller parts for executing the processing like the cases of FIG. 9(A) to FIG. 9(D) are reduced, and hence the error correction processing speed and the like is enhanced. Further, in the modified examples, even if the portions where the errors are centralized are decentralized in one sector data, it is expected such error correction can be executed. Still further, although two ECC controller parts are provided in the second embodiment, four or eight ECC controller parts may be provided to increase the number of division of one sector data. With such an arrangement, it is expected to attain the same effect as the first embodiment, and to increase cases where error correction can be executed by a hardware without imposing the burden on the design of circuit construction.

Although the semiconductor disk unit of the invention is explained in detail with reference to the attached drawings, the invention is not limited to the embodiments as set forth above. For example, although it has been explained that the error correction by a hardware is 1 bit, and error correction by a firmware is 2 to 3 bits, and four bit or more errors are uncorrectable, it is needless to say that the number of these bits can be changed by changing the design of the semiconductor disk unit. Accordingly, if error correction can be executed by a hardware up to several bits, it is expected that error correction processing speed can be enhanced and data correction can be executed even if there occur many errors. As a result, the reliability of the semiconductor disk unit of the invention can be further enhanced, realizing the maintenance of the quality thereof.

INDUSTRIAL APPLICABILITY

As mentioned in detail above, the invention is suitable for use in a semiconductor disk unit, particularly to a semiconductor disk unit having an error correction function.

What is claimed is:

1. A semiconductor disk unit for reading data from a semiconductor memory in units of a given amount of bits comprising:

a memory part comprising the semiconductor memory;

a temporary storage part for holding the given amount of bit data so as to transfer the same data to the memory part;

a division part for dividing the given amount of bit data to be transferred from the temporary storage part to the memory part into a plurality of sub-data; and an error correction code controller part for generating an error correction code data for every sub-data which is added to the data and stored in the memory part, said error correction code controller part deciding whether the data read from the memory part has an error or not for every sub-data based on the error correction code data, and executing necessary error correction.

2. The semiconductor disk unit according to claim 1, wherein the plurality of sub-data and the plurality of error correction code data generated corresponding to the sub-data are alternately stored in the memory part.

3. The semiconductor disk unit according to claim 2, wherein the memory part is formed of a nonvolatile memory which is erasable by the batch.

4. The semiconductor disk unit according to claim 1, wherein the plurality of sub-data and the plurality of error correction code data generated corresponding to the sub-data are collectively stored in the memory part.

5. The semiconductor disk unit according to claim 4, wherein the memory part is formed of a nonvolatile memory which is erasable by the batch.

6. The semiconductor disk unit according claim 1, wherein the memory part is formed of a nonvolatile memory which is erasable by the batch.

7. A semiconductor disk unit for reading data from a semiconductor memory in units of a given amount of bits comprising:

a memory part comprising the semiconductor memory;

a temporary storage part for holding a given amount of bit data so as to transfer the same data to the memory part;

a division part for dividing the given amount of bit data to be transferred from the temporary storage part to the memory part into a plurality of sub-data; and first and second error correction code controller parts for generating error correction code data in selected parts of the respective sub-data which are added to the data and stored in the memory part, said first and second error correction code controller parts deciding whether the data read from the memory part has an error or not for every selected part parts of the sub-data based on the error correction code data, and executing necessary error correction; and a transfer gate part capable of selectively transferring between one of the first and second error correction code controller parts and the memory part wherein the transfer gate part transfers invalid data in operation to another of two error correction code controller parts in a state where data can be transferred between one of two error correction code controller parts and the memory part.

8. The semiconductor disk unit according to claim 7, wherein the memory part is formed of a nonvolatile memory which is erasable by the batch.

9. A semiconductor disk unit for reading data from a semiconductor memory in units of a given amount of bits comprising:

a memory part comprising the semiconductor memory;

a temporary storage part for holding a given amount of bit data so as to transfer the same data to the memory part;

a division part for dividing the given amount of bit data to be transferred from the temporary storage part to the memory part into a plurality of sub-data, and first and second error correction code controller parts for generating error correction code data in selected parts of the respective sub-data which are added to the data and stored in the memory part, said first and second error correction code controller parts deciding whether the data read from the memory part has an error or not for every selected part parts of the sub-data based on the error correction code data, and executing necessary error correction; and a transfer gate part capable of selectively transferring between one of the first and second error correction code controller parts and the memory part, wherein the transfer gate part can transfer a part of consecutive data of the plurality of sub-data to the first error correction code controller part and can transfer another part of consecutive data of the plurality of sub-data to the second error correction code controller part.

10. The semiconductor disk unit according to claim 9, wherein the memory part is formed of a nonvolatile memory which is erasable by the batch.

11. A semiconductor disk unit for reading data from a semiconductor memory in units of a given amount of bits comprising:

a memory part comprising the semiconductor memory;

a temporary storage part for holding a given amount of bit data so as to transfer the same data to the memory part;

a division part for dividing the given amount of bit data to be transferred from the temporary storage part to the memory part into a plurality of sub-data; and first and second error correction code controller parts for generating error correction code data in selected parts of the respective sub-data which are added to the data and stored in the memory part, said first and second error correction code controller parts deciding whether the data read from the memory part has an error or not for every selected part parts of the sub-data based on the error correction code data, and executing necessary error correction; and a transfer gate part capable of selectively transferring between one of the first and second error correction code controller parts and the memory part, wherein the transfer gate part can transfer a part of inconsecutive data of the plurality of sub-data to the first error correction code controller part and can transfer another part of inconsecutive data of the plurality of sub-data to the second error correction code controller part.

12. The semiconductor disk unit according to claim 11, wherein the memory part is formed of a nonvolatile memory which is erasable by the batch.

* * * * *